United States Patent
Machinaga et al.

(10) Patent No.: US 10,512,200 B1
(45) Date of Patent: Dec. 17, 2019

(54) ELECTROMAGNETIC WAVE ABSORBER AND MOLDED ARTICLE WITH ELECTROMAGNETIC WAVE ABSORBER

(71) Applicant: NITTO DENKO CORPORATION, Ibaraki-shi, Osaka (JP)

(72) Inventors: Hironobu Machinaga, Osaka (JP); Hiroichi Ukei, Osaka (JP); Takehiro Ui, Osaka (JP); Kazuto Yamagata, Osaka (JP); Yuuki Takeda, Osaka (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 16/488,418

(22) PCT Filed: Dec. 11, 2017

(86) PCT No.: PCT/JP2017/044443
§ 371 (c)(1),
(2) Date: Aug. 23, 2019

(87) PCT Pub. No.: WO2018/159058
PCT Pub. Date: Sep. 7, 2018

(30) Foreign Application Priority Data

Mar. 3, 2017 (JP) ................................. 2017-040839

(51) Int. Cl.
*B32B 7/02* (2019.01)
*B32B 15/08* (2006.01)
*H05K 9/00* (2006.01)

(52) U.S. Cl.
CPC ............. *H05K 9/0084* (2013.01); *B32B 7/02* (2013.01); *B32B 15/08* (2013.01)

(58) Field of Classification Search
CPC .................................................... H05K 9/0084
(Continued)

(56) References Cited

U.S. PATENT DOCUMENTS

2015/0250078 A1* 9/2015 Matsuda ................... B32B 7/02
349/12
2015/0289423 A1* 10/2015 Imahori ................. H01F 17/06
307/10.1
(Continued)

FOREIGN PATENT DOCUMENTS

JP 2002-118008 A 4/2002
JP 2002-374091 A 12/2002
(Continued)

OTHER PUBLICATIONS

International Search Report dated Feb. 27, 2018, issued in counterpart International Application No. PCT/JP2017/044443 (1 page).
(Continued)

*Primary Examiner* — Timothy J Thompson
*Assistant Examiner* — Michael F McAllister
(74) *Attorney, Agent, or Firm* — Westerman, Hattori, Daniels & Adrian, LLP

(57) ABSTRACT

An electromagnetic wave absorber (1a) includes: a first layer (10a) being a dielectric layer or a magnetic layer; and a conductive layer (20a) provided on at least one surface of the first layer (10a). The conductive layer (20a) has a sheet resistance of 100Ω/□ or less after the electromagnetic wave absorber (1a) is exposed to an environment having a temperature of 85° C. and a relative humidity of 85% for 1000 hours. The electromagnetic wave absorber (1a) has a flexural rigidity of 7000 MPa·mm$^4$ or less.

14 Claims, 2 Drawing Sheets

(58) Field of Classification Search
USPC .......................................................... 174/350
See application file for complete search history.

(56) References Cited

U.S. PATENT DOCUMENTS

2015/0334883 A1    11/2015  Yamamoto
2016/0120077 A1*    4/2016  Watanabe ............ H05K 1/0216
                                                                174/377
2018/0319138 A1*   11/2018  Ukei .................... H05K 9/0088

FOREIGN PATENT DOCUMENTS

| JP | 2003-198179 A | 7/2003 |
| JP | 2004-296758 A | 10/2004 |
| JP | 2005-85966 A | 3/2005 |
| JP | 2005-203438 A | 7/2005 |
| JP | 2009-239211 A | 10/2009 |
| JP | 2012-94764 A | 5/2012 |
| WO | 2014/098065 A1 | 6/2014 |

OTHER PUBLICATIONS

Decision to Grant a Patent dated Feb. 12, 2019, issued in counterpart of Japanese Patent Application No. 2017-040839 with English Translation (6 pages).
Notification of Reasons for Refusal dated May 29, 2018, issued in counterpart of Japanese Patent Application No. 2017-040839 with English Translation (14 pages).
Decision of Refusal dated Oct. 16, 2018, issued in counterpart of Japanese Patent Application No. 2017-040839 with English Translation (12 pages).

* cited by examiner

ELECTROMAGNETIC WAVE ABSORBER AND MOLDED ARTICLE WITH ELECTROMAGNETIC WAVE ABSORBER

TECHNICAL FIELD

The present invention relates to an electromagnetic wave absorber and a molded article with an electromagnetic wave absorber.

BACKGROUND ART

In recent years, electromagnetic waves in a range of millimeter waves having a wavelength of about 1 to 10 mm and a frequency of 30 to 300 GHz and quasi-millimeter waves have been used as information communication media. The use of such electromagnetic waves in anti-collision systems has been under consideration. An anti-collision system is a system, for example, installed in a vehicle, detecting obstacles to automatically put on the brakes, or measuring the speed of vehicles around the vehicle equipped with the system and distance between the vehicle and another vehicle to adjust the speed of the vehicle and distance between the two vehicles. To allow anti-collision systems to normally operate, reception of as few unnecessary electromagnetic waves as possible is important for prevention of false recognition. Therefore, it is conceivable to use an electromagnetic wave absorber to absorb electromagnetic waves unnecessary for anti-collision systems.

There are various types of electromagnetic wave absorbers classified according to their principles of electromagnetic wave absorption. For example, an electromagnetic wave absorber provided with an electromagnetic wave reflective layer, a dielectric layer having a thickness of $\lambda/4$ ($\lambda$ is a wavelength of an electromagnetic wave to be absorbed), and a resistive film layer (such an electromagnetic wave absorber may be referred to as "$\lambda/4$ electromagnetic wave absorber") can be produced at a low cost owing to relatively inexpensive materials and ease of design. For example, Patent Literature 1 proposes an electromagnetic wave absorber exercising an excellent property of functioning in a wide incident angular range as a $\lambda/4$ electromagnetic wave absorber. Additionally, Patent Literature 2 describes an electromagnetic wave absorption material having a magnetic layer.

CITATION LIST

Patent Literature

Patent Literature 1: JP 2003-198179 A
Patent Literature 2: JP 2012-094764 A

SUMMARY OF INVENTION

Technical Problem

In Patent Literatures 1 and 2, the shape of an article to which the electromagnetic wave absorbers are attached and a possible environment where the electromagnetic wave absorbers are used are not specifically discussed.

Therefore, the present invention provides an electromagnetic wave absorber advantageous in attaching to a non-flat face and capable of reducing performance deterioration in a hot and humid environment (for example, having a temperature of 80° C. or more and a relative humidity of 85% or more) over a long period of time (for example, 1000 hours or more).

Solution to Problem

The present invention provides an electromagnetic wave absorber, including:
a first layer being a dielectric layer or a magnetic layer; and
a conductive layer provided on at least one surface of the first layer, wherein
the conductive layer has a sheet resistance of 100Ω/□ or less after the electromagnetic wave absorber is exposed to an environment having a temperature of 85° C. and a relative humidity of 85% for 1000 hours, and
the electromagnetic wave absorber has a flexural rigidity of 7000 MPa·mm$^4$ or less.

The present invention also provides a molded article with an electromagnetic wave absorber, including:
a molded article; and
the above electromagnetic wave absorber attached to the molded article.

Advantageous Effects of Invention

The above electromagnetic wave absorber is easily attached to a non-flat face and the performance of the above electromagnetic wave absorber is unlikely to be deteriorated when the above electromagnetic wave absorber is exposed to a hot and humid environment over a long period of time.

DESCRIPTION OF EMBODIMENTS

Figure 1:
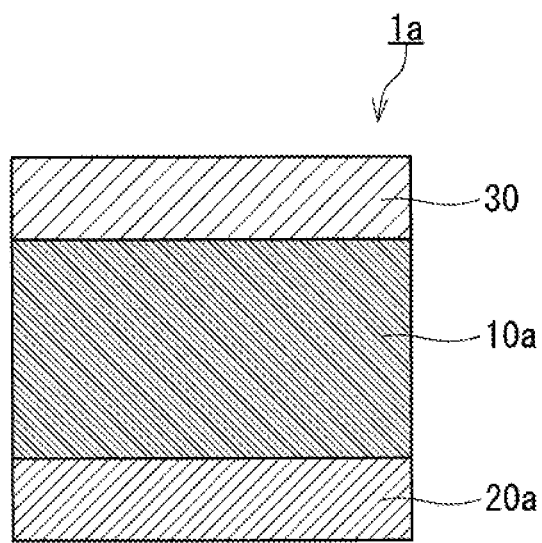
FIG. 1 is a cross-sectional view showing an example of an electromagnetic wave absorber of the present invention.

Hereinafter, an embodiment of the present invention will be described with reference to the drawings. The following description describes examples of the present invention, and the present invention is not limited to the following embodiment.

If electromagnetic wave absorbers can be adhered to a non-flat face such as a curved face, the application range of electromagnetic wave absorbers expands. An exemplary application of electromagnetic wave absorbers is an anti-collision system installed in a motor vehicle. Most millimeter-wave radars of conventional anti-collision systems emit a millimeter wave ahead of a motor vehicle, and electromagnetic wave absorbers tend to be adhered to a flat face. However, if a millimeter wave can also be emitted obliquely forward or obliquely backward from a motor vehicle to detect obstacles, vehicle driving safety can be enhanced more. Accordingly, it is conceivable that a millimeter-wave radar will be disposed at a corner of a motor vehicle. In this case, an electromagnetic wave absorber is desirably adhered to an end of an automotive part such as a bumper to prevent electromagnetic wave interference, and a demand for an electromagnetic wave absorber easily adhered to a non-flat face such as a curved face is expected to increase. It should be noted that a motor vehicle-installed anti-collision system is merely an exemplary application of electromagnetic wave absorbers.

It is thought that when an electromagnetic wave absorber has a dielectric layer or magnetic layer and a conductive layer, reduction in thickness of each layer makes it easy to attach the electromagnetic wave absorber to a non-flat face. However, the thickness of the dielectric layer or magnetic layer is determined according to the wavelength of an electromagnetic wave to be absorbed, and thus the reduction in thickness of the dielectric layer or magnetic layer is limited. If the electromagnetic wave absorber includes the conductive layer reduced in thickness, a conductive material, such as a metal, included in the conductive layer corrodes and the sheet resistance of the conductive layer increases by exposure to a hot and humid environment over a long period of time. This may make it difficult for the electromagnetic wave absorber to exhibit desired performance. Moreover, according to the technique described in Patent Literature 1, a first dielectric layer, a film forming a resistive thin layer, a second dielectric layer, an aluminum sheet behaving as an electromagnetic wave reflective layer are stacked in this order with a double-sided adhesive sheet. An acid component included in the double-sided adhesive sheet may corrode the electromagnetic wave reflective layer in a hot and humid environment. As described above, it is not easy for an electromagnetic wave absorber to achieve both the ease of attachment to a non-flat face and maintenance of the performance in a hot and humid environment over a long period of time.

Therefore, the present inventors conducted intensive studies and have discovered that various twists given particularly to a conductive layer enables an electromagnetic wave absorber to achieve both the ease of attachment to a non-flat face and maintenance of the performance in a hot and humid environment over a long period of time. Based on this new finding, the present inventors have invented an electromagnetic wave absorber according to the present invention.

As shown in FIG. 1, an electromagnetic wave absorber 1a includes a first layer 10a and conductive layer 20a. The first layer 10a is a dielectric layer or magnetic layer. The conductive layer 20a is provided on at least one surface of the first layer 10a. The conductive layer 20a has a sheet resistance of 100Ω/□ or less after the electromagnetic wave absorber 1a is exposed to an environment having a temperature of 85° C. and a relative humidity of 85% for 1000 hours. Moreover, the electromagnetic wave absorber 1a has a flexural rigidity of 7000 MPa·mm$^4$ or less. The sheet resistance of the conductive layer 20a of the electromagnetic wave absorber 1a can be measured, for example, by a non-contact resistance measurement method such as an eddy current method. The flexural rigidity EI [MPa·mm$^4$] of the electromagnetic wave absorber 1a can be determined in such a manner that one end of a test sample is fixed to form a cantilever, a downward load is applied by a weight at the other end of the test sample to bend and deform the test sample, the resultant deflection d [cm] is measured, and the flexural rigidity EI [MPa·mm$^4$] is calculated according to the following equation (1). In the following equation (1), W represents the basis weight [g/m$^2$] of a test sample, L represents the length [cm] of the test sample, b represents the width [cm] of the test sample, F represents the weight [g] of a weight, and d represents the deflection [cm].

$$EI=\{(WLb/8)\times 10^{-4}+(F/3)\}\times(L/d)\times(9.81/10)  \quad \text{Equation (1)}$$

Since the electromagnetic wave absorber 1a has a flexural rigidity of 7000 MPa·mm$^4$ or less, it is easy to attach the electromagnetic wave absorber 1a to a non-flat face such as a curved face. Additionally, since the conductive layer 20a has a sheet resistance of 100Ω/□ or less after the electromagnetic wave absorber 1a is exposed to an environment having a temperature of 85° C. and a relative humidity of 85% for 1000 hours, the performance of the electromagnetic wave absorber 1a is unlikely to be deteriorated by exposing the electromagnetic wave absorber 1a to a hot and humid environment over a long period of time. Therefore, for example, the electromagnetic wave absorber 1a can exhibit good transmission attenuation performance: The transmission loss of a 76-GHz millimeter wave measured according to Japanese Industrial Standards (JIS) R 1679 after the exposure to an environment having a temperature of 85° C. and a relative humidity of 85% for 1000 hours is 10 dB or more. When the transmission loss of a 76-GHz millimeter wave is 10 dB or more in the electromagnetic wave absorber 1a, a millimeter wave does not pass through the conductive layer 20a and reflects toward the first layer 10a which is a dielectric layer or magnetic layer, and thus the electromagnetic wave absorber 1a can exhibit desired electromagnetic wave absorption performance.

In the electromagnetic wave absorber 1a, the transmission loss, obtained after the exposure to an environment having a temperature of 85° C. and a relative humidity of 85% for 1000 hours, of a 76-GHz millimeter wave is preferably 20 dB or more and more preferably 40 dB or more. The upper limit of the transmission loss is 100 dB, which is a measurement limit. In terms of the electromagnetic wave absorption performance, in the electromagnetic wave absorber 1a, the amount of reflection and absorption of a 76-GHz millimeter wave measured according to Japanese Industrial Standards (JIS) R 1679 after the exposure to an environment having a temperature of 85° C. and a relative humidity of 85% for 1000 hours is, for example, 15 dB or more, preferably 20 dB or more, and more preferably 30 dB or more. The upper limit of the amount of reflection and absorption is 100 dB, which is a measurement limit.

The electromagnetic wave absorber 1a has a flexural rigidity of desirably 10 to 5000 MPa·mm$^4$, more desirably 70 to 3500 MPa·mm$^4$, even more desirably 80 to 3000 MPa·mm$^4$, particularly desirably 80 to 900 MPa·mm$^4$, and most desirably 80 to 400 MPa·mm$^4$.

The conductive layer 20a includes, for example, a metal. This allows the conductive layer 20a to have low sheet resistance. It should be noted that alloys are included in metals herein. Examples of the metal included in the conductive layer 20a include copper, nickel, zinc, their alloys, aluminum, gold, and stainless steel.

For example, in the electromagnetic wave absorber 1a, a product P1 of the Young's modulus of the conductive layer 20a and the thickness of the conductive layer 20a is 0.01 to 34000 MPa·mm. In this case, the electromagnetic wave absorber 1a more reliably has a flexural rigidity of 7000 MPa·mm$^4$ or less. The product P1 is desirably 0.01 to 30000 MPa, more desirably 0.01 to 7000 MPa, and even more desirably 0.01 to 1500 MPa. This makes it easier to decrease the flexural rigidity of the electromagnetic wave absorber 1a.

For example, in the electromagnetic wave absorber 1a, a product P2 of the Young's modulus of the first layer 10a and the thickness of the first layer 10a is 0.1 to 1200 MPa·mm. In this case, the electromagnetic wave absorber 1a more reliably has a flexural rigidity of 7000 MPa·mm⁴ or less. The product P2 is, in some cases, 0.1 to 1000 MPa·mm or 0.1 to 500 MPa·mm, and can be 0.1 to 100 MPa·mm.

The first layer 10a has desirably a Young's modulus of 0.1 to 2500 MPa, more desirably a Young's modulus of 0.5 to 2000 MPa, and even more desirably a Young's modulus of 0.5 to 1000 MPa. This makes it likely that the electromagnetic wave absorber 1a has lower flexural rigidity (for example, 4500 MPa·mm⁴ or less) and makes it easy to adhere the electromagnetic wave absorber 1a to a curved face having a relatively small curvature radius.

The first layer 10a has a thickness of, for example, 50 to 2000 µm, desirably 100 to 1500 µm, and more desirably 200 to 1000 µm. This can increase the dimensional accuracy of the thickness of the first layer 10a and decrease the raw material cost of the first layer 10a.

Figure 2A:
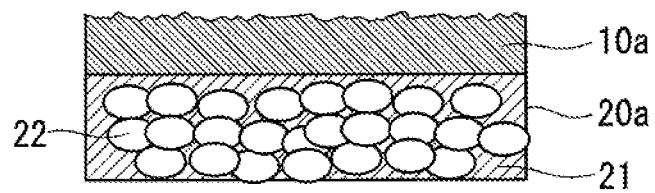
FIG. 2A is a cross-sectional view showing a portion of the electromagnetic wave absorber shown in FIG. 1.

As shown in FIG. 2A, the conductive layer 20a includes, for example, metal particles 22 subjected to a surface treatment. In this case, the metal particles 22 are unlikely to corrode when the electromagnetic wave absorber 1a is exposed to a hot and humid environment over a long period of time. Therefore, the performance of the electromagnetic wave absorber 1a is unlikely to be deteriorated when the electromagnetic wave absorber 1a is exposed to a hot and humid environment over a long period of time. Especially, the transmission loss of an electromagnetic wave to be absorbed by the electromagnetic wave absorber 1a is unlikely to decrease.

Examples of a surface-treated metal included in the metal particles 22 include copper, nickel, zinc, and their alloys. The material with which the surface of the above metal is treated and which is included in the metal particles 22 is silver, gold, nickel, copper, or cobalt. Among these, the surface treatment is desirably performed with silver which has good electrical conductivity. For example, the mass of the surface treatment agent in the metal particles 22 is 5 to 30%, desirably 5 to 20%, and more desirably 10 to 20%, of the total mass of the metal particles 22. In this case, when the surface treatment is performed, for example, with silver, the surface of the metal particles 22 has good electrical conductivity and the raw material cost of the metal particles 22 can be reduced.

For example, the metal particles 22 are in contact with each other in the conductive layer 20a. When the conductive layer 20a includes the metal particles 22, the conductive layer 20a, for example, further includes a binder 21. At least a portion of the surface of the metal particles 22 is in contact with the binder 21 in the conductive layer 20a, and the metal particles 22 are dispersed in the conductive layer 20a. Examples of the binder 21 include acrylic resin, ethylene-vinyl acetate copolymer (EVA), acrylonitrile-butadiene rubber (NBR), nitrile rubber, ethylene-propylene-diene rubber, silicone rubber, and polyurethane. In terms of flexibility and extensibility, the binder 21 is desirably acrylic resin or polyurethane. The conductive layer 20a including the metal particles 22 can thus be produced.

The metal particles 22 have an average particle diameter of, for example, 1 to 100 µm, more preferably 1 to 50 µm, and even more preferably 1 to 20 µm. In the case where the metal particles 22 have an average particle diameter of 1 µm or more, the metal particles 22 are easily brought into contact with each other while the amount of the metal particles 22 added is reduced. Additionally, in the case where the metal particles 22 have an average particle diameter of 100 µm or less, the thickness of the conductive layer 20a can be decreased and, when the electromagnetic wave absorber 1a is bent, the metal particles 22 are likely to be maintained in contact with each other. The average particle diameter of the metal particles 22 is a median diameter (D50) at 50% in a volume-based cumulative distribution obtained, for example, by a laser diffraction-scattering particle size distribution measurement method.

Figure 2B:
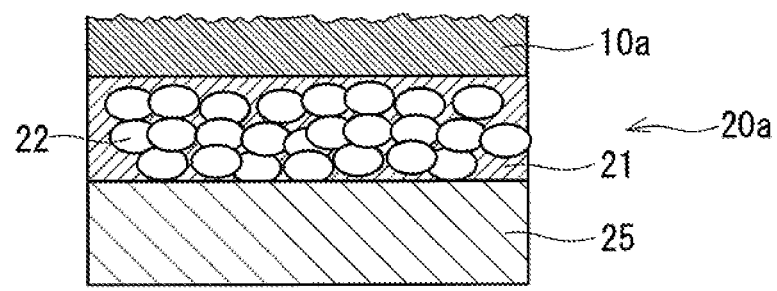
FIG. 2B is a cross-sectional view showing a portion of a modification of the electromagnetic wave absorber shown in FIG. 1.

As shown in FIG. 2B, the conductive layer 20a may include a support 25 which is a polymer sheet. In this case, the conductive layer 20a can be produced easily by forming a layer of a composition including an effective component (for example, the metal particles 22) of the conductive layer 20a on the support 25. Additionally, the first layer 10a is more easily formed to have a desired thickness. Examples of the material of the polymer sheet usable as the support 25 include polyethylene terephthalate (PET), polyethylene naphthalate (PEN), acrylic resin, polycarbonate (PC), polyolefin, polyethylene (PE), polypropylene (PP), cycloolefin polymer (COP), polyurethane, urethane acrylic resin, cast polypropylene (CPP), and vinylidene chloride resin.

As shown in FIG. 2B, in the conductive layer 20a, the layer including the effective component of the conductive layer 20a is disposed closer to the first layer 10a than is the support 25. In this case, the effective component of the conductive layer 20a can be protected by the support 25 when the electromagnetic wave absorber 1a is exposed to a hot and humid environment over a long period of time. In the conductive layer 20a, the support 25 may be disposed closer to the first layer 10a than is the layer including the effective component of the conductive layer 20a.

The support 25 of the conductive layer 20a has a thickness of, for example, 10 to 150 µm, desirably 20 to 100 µm, and more desirably 30 to 80 µm. This can decrease the flexural rigidity of the conductive layer 20a, and can reduce occurrence of a crease or deformation in the case where the layer including the effective component of the conductive layer 20a is formed.

The conductive layer 20a may include a metal foil having a thickness of, for example, 1 to 490 µm. Owing to the metal foil having a thickness of 1 µm or more, the sheet resistance of the conductive layer 20a can be maintained at 100Ω/□ or less when the electromagnetic wave absorber 1a is exposed to a hot and humid environment over a long period of time to cause corrosion of the metal foil by moisture or an acid component included in an adhesive. Additionally, owing to the metal foil having a thickness of 490 µm or less, the electromagnetic wave absorber 1a reliably has a flexural rigidity of 7000 MPa·mm⁴ or less.

The thickness of the metal foil is desirably 1 to 450 µm, more desirably 1 to 200 µm, and even more desirably 1 to 100 µm. This makes it easier to decrease the flexural rigidity of the electromagnetic wave absorber 1a.

Examples of the metal foil include aluminum foil, copper foil, gold foil, titanium foil, nickel foil, magnesium foil, aluminum alloy foil, copper alloy foil, gold alloy foil, titanium alloy foil, nickel alloy foil, magnesium alloy foil, and stainless steel foil. Among these, aluminum foil is desirably used as the metal foil. This is because aluminum foil is available at a low price and the production cost of the electromagnetic wave absorber 1a can be reduced.

When the conductive layer 20a includes the metal foil, the conductive layer 20a may include, as described above, the support 25 which is a polymer sheet. The metal foil having a thickness of 10 µm or less, in particular, may be difficult to treat, and thus such a metal foil is desirably placed on a sheet made of a polyester such as PET. Moreover, the corrosion of the conductive layer 20a can be reduced by the support 25 when the electromagnetic wave absorber 1a is exposed to a hot and humid environment over a long period of time. The ratio (thickness of metal foil:thickness of support) between the thickness of the metal foil and the thickness of the support is preferably 1:0.1 to 1:10. If the ratio of the thickness of the metal foil is low, the flexibility is good but the transmission attenuation properties are difficult to increase in the electromagnetic wave absorber 1a. If the ratio of the thickness of the metal foil is high, the transmission attenuation properties are good but the flexibility is difficult to increase in the electromagnetic wave absorber 1a. When the ratio between the thickness of the metal foil and the thickness of the support is within the above range, both good flexibility and good transmission attenuation properties are easily achieved in the electromagnetic wave absorber 1a.

For example, the electromagnetic wave absorber 1a is assumed to be used in conjunction with a millimeter-wave radar installed in a vehicle. If a millimeter wave passes through the electromagnetic wave absorber 1a, the millimeter-wave radar may be led to false detection by an electromagnetic wave emitted by the millimeter-wave radar, diffusely reflected by a metallic portion of the vehicle, and received by the millimeter-wave radar. Therefore, the sheet resistance of the conductive layer 20a is desirably as small as possible. The conductive layer 20a has a sheet resistance of, for example, 100Ω/□ or less and desirably 20Ω/□ or less.

As shown in FIG. 1, the electromagnetic wave absorber 1a further includes, for example, a resistive layer 30. The resistive layer 30 is provided on at least one surface of the first layer 10a. The first layer 10a is a dielectric layer and disposed between the resistive layer 30 and conductive layer 20a. In this case, the electromagnetic wave absorber 1a is typically a λ/4 electromagnetic wave absorber.

In the case where the electromagnetic wave absorber 1a is a λ/4 electromagnetic wave absorber, the electromagnetic wave absorber 1a is designed so that incidence of an electromagnetic wave having a wavelength ($\lambda_0$) to be absorbed will result in interference between the electromagnetic wave reflected by the surface of the resistive layer 30 (front surface reflection) and the electromagnetic wave reflected by the conductive layer 20a (back surface reflection). Therefore, if the sheet resistance of the conductive layer 20a is high (for example, higher than 100Ω/□), an electromagnetic wave passes through the conductive layer 20a and the amount of an electromagnetic wave absorption achieved by the electromagnetic wave absorber 1a is decreased. In the λ/4 electromagnetic wave absorber, the wavelength ($\lambda_0$) of an electromagnetic wave to be absorbed is determined according to the thickness (t) of the first layer 10a which is a dielectric layer and the relative permittivity ($\varepsilon_r$) of the dielectric layer, as shown in the following equation (2). That is, an electromagnetic wave having a wavelength ($\lambda_0$) to be absorbed can be set by appropriately adjusting the material and thickness of the first layer 10a which is a dielectric layer. In the equation (2), sqrt ($\varepsilon_r$) means a square root of the relative permittivity ($\varepsilon_r$).

$$\lambda_0 = 4t \times \text{sqrt}(\varepsilon_r) \qquad \text{Equation (2)}$$

As described above, the resistive layer 30 is disposed to reflect an electromagnetic wave having a wavelength to be absorbed in the vicinity of the surface of the electromagnetic wave absorber 1a. The resistive layer 30 has a sheet resistance of, for example, 200 to 600Ω/□ and desirably 360 to 500Ω/□. This makes it easy for the electromagnetic wave absorber 1a to selectively absorb an electromagnetic wave having a wavelength generally employed by a millimeter-wave radar or quasi-millimeter-wave radar. For example, the electromagnetic wave absorber 1a can effectively attenuate an electromagnetic wave having a frequency of 20 to 90 GHz, particularly 60 to 90 GHz, employed by a millimeter-wave radar.

The resistive layer 30 includes, for example, a layer (hereinafter referred to as "functional layer") formed of a metal oxide including at least one selected from the group consisting of indium, tin, and zinc as a main component; an electrically conductive polymer; a carbon nanotube; a metal nanowire; or a metal mesh. In particular, the functional layer of the resistive layer 30 is desirably formed of indium tin oxide (ITO) in terms of the stability of the sheet resistance in the resistive layer 30 and durability of the resistive layer 30. In this case, the material forming the functional layer of the resistive layer 30 is desirably an ITO including 20 to 40 weight % of $SnO_2$ and more desirably an ITO including 25 to 35 weight % of $SnO_2$. An ITO including $SnO_2$ in such a range has an extremely stable amorphous structure and can reduce variation in sheet resistance of the resistive layer 30 in a hot and humid environment. The sheet resistance of the resistive layer 30 refers to a value obtained by measuring, for example, a surface defined by the functional layer. The "main component" as described herein refers to a component affecting the properties of a material including the component, and the content of such a component is commonly 50 weight % or more of the total weight of the material.

The functional layer of the resistive layer 30 has a thickness of, for example, 10 to 100 nm and desirably 25 to 50 nm. This makes it likely that the sheet resistance of the resistive layer 30 is stable even when the electromagnetic wave absorber 1a is affected by a time-dependent change or an environmental change.

The resistive layer 30 may further include, for example, a support supporting the functional layer. In this case, the resistive layer 30 can be produced, for example, by forming the functional layer on the support by a layer forming method such as sputtering or coating (for example, bar coating). In this case, the support also serves as an auxiliary member capable of adjusting the thickness of the functional layer with high accuracy. In this case, examples of the material of the support of the resistive layer 30 include materials mentioned as examples of the materials of the support of the conductive layer 20a. The material of the support of the resistive layer 30 may be the same as the material of the support of the conductive layer 20a, or may be different from the material of the support of the conductive layer 20a. In particular, the material of the support of the resistive layer 30 is desirably PET in terms of the balance among good heat-resistance, the dimensional stability, and cost. The support can be omitted from the resistive layer 30 as appropriate.

In the resistive layer 30 including the support, the functional layer may be disposed closer to the first layer 10a than is the support, or the support may be disposed closer to the first layer 10a than is the functional layer.

The thickness of the support of the resistive layer 30 may be the same as the thickness of the support 25 of the conductive layer 20a, or may be different from the thickness of the support 25 of the conductive layer 20a. The support of the resistive layer 30 has a thickness of, for example, 10 to 150 µm, desirably 20 to 100 µm, and more desirably 30 to 80 µm. This can decrease the flexural rigidity of the resistive layer 30, and can reduce occurrence of a crease or deformation in the case where the functional layer of the resistive layer 30 is formed.

When the electromagnetic wave absorber 1a is a λ/4 electromagnetic wave absorber, the dielectric layer 10a is formed of a polymer sheet having a relative permittivity of, for example, 1 to 20. The dielectric layer 10a is formed of a polymer sheet having a relative permittivity of, more desirably, 2 to 20. This makes it likely that the electromagnetic wave absorber 1a exhibits desired electromagnetic wave absorption performance. The relative permittivity of the dielectric layer 10a can be measured, for example, by a free-space method.

Examples of the material of the polymer sheet of the dielectric layer 10a include synthetic resins such as ethylene-vinyl acetate copolymer (EVA), polyvinyl chloride, polyurethane, acrylic resin, acrylic urethane resin, polyolefin, polypropylene, polyethylene, silicone resin, polyethylene terephthalate, polyester, polystyrene, polyimide, polycarbonate, polyamide, polysulfone, polyethersulfone, and epoxy resin and synthetic rubbers such as polyisoprene rubber, polystyrene-butadiene rubber, polybutadiene rubber, chloroprene rubber, acrylonitrile-butadiene rubber, butyl rubber, acrylic rubber, ethylene propylene rubber, and silicone rubber. One of these may be used alone as the material of the polymer sheet of the dielectric layer 10a, or a combination of two or more thereof may be used as the material of the polymer sheet of the dielectric layer 10a. In terms of decreasing the thickness of the dielectric layer 10a to decrease the thickness of the electromagnetic wave absorber 1a, polyurethane, acrylic resin, or acrylic urethane resin is desirably used as the material of the polymer sheet of the dielectric layer 10a. In terms of the moldability and relative permittivity, it is also desirable to use EVA as the material of the polymer sheet of the dielectric layer 10a.

The dielectric layer 10a may be a single layer, or may be a laminate consisting of a plurality of layers. When the dielectric layer 10a is a laminate consisting of a plurality of layers, the relative permittivity of the dielectric layer 10a can be determined by measuring the respective layers for the relative permittivity, multiplying the obtained relative permittivity values of the respective layers by the proportions of the thicknesses of the respective layers to the thickness of the whole dielectric layer 10a, and adding the resultant values.

When the electromagnetic wave absorber 1a is a λ/4 electromagnetic wave absorber and a dielectric layer is disposed on the external side of the resistive layer 30, only a non-porous layer having a relative permittivity of 2 or more is disposed as such a dielectric layer. If a porous body is provided on a surface of an electromagnetic wave absorber and the electromagnetic wave absorber is left in a humid environment over a long period of time, the electromagnetic wave absorbing properties of the electromagnetic wave absorber may decrease due to moisture absorption.

A molded article with an electromagnetic wave absorber, for example, can be produced using the electromagnetic wave absorber 1a. The molded article with an electromagnetic wave absorber includes a molded article and the electromagnetic wave absorber 1a attached to the molded article. Examples of the molded article include automotive parts such as a bumper.

An example of a method for producing the electromagnetic wave absorber 1a will be described. The functional layer is formed on a support formed in a sheet shape by a layer forming method such as vapor deposition, sputtering, or coating (for example, bar coating) to produce the resistive layer 30. It is desirable that the functional layer of the resistive layer 30 be formed by, in particular, sputtering to strictly adjust the sheet resistance of the resistive layer 30 and the thickness of the functional layer of the resistive layer 30. The conductive layer 20a is produced by applying a coating liquid containing the metal particles 22 onto another support 25 formed in a sheet shape and hardening the resultant coating or by putting the metal foil on another support 25 formed in a sheet shape.

Next, a resin composition press-molded to have a predetermined thickness and forming the first layer 10a is put on one principal surface of the conductive layer 20a. Afterward, one principal surface of the resistive layer 30 is placed on the resin composition forming the first layer 10a. The resin composition is cured if necessary. The electromagnetic wave absorber 1a can be produced in this manner. According to this method, the thickness of the dielectric layer 30 is controlled easily, and thus the electromagnetic wave absorber 1a can be produced so that an electromagnetic wave having a wavelength to be absorbed can be absorbed effectively. Moreover, since the resistive layer 30 and conductive layer 20a are formed separately, the time required to produce the electromagnetic wave absorber 1a is short and the production cost of the electromagnetic wave absorber 1a is low.

<Modification>

The electromagnetic wave absorber 1a can be modified in various respects. The electromagnetic wave absorber 1a may be modified, for example, to further include an adhesive layer. In this case, the adhesive layer is disposed on the external side of the conductive layer 20a. This makes it easy to attach the electromagnetic wave absorber 1a to an article such as a molded article.

Figure 3:
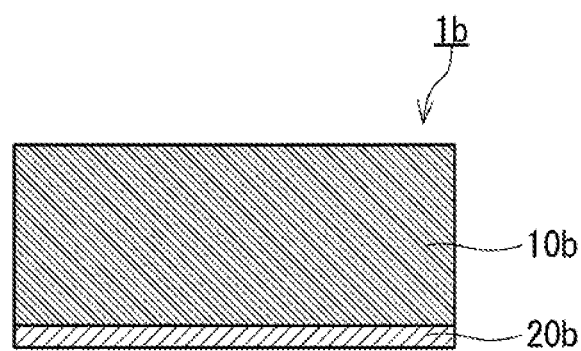
FIG. 3 is a cross-sectional view showing another example of the electromagnetic wave absorber of the present invention.

The electromagnetic wave absorber 1a may be modified to give an electromagnetic wave absorber 1b shown in FIG. 3. The electromagnetic wave absorber 1b is configured in the same manner as the electromagnetic wave absorber 1a, unless otherwise described. The description given for the electromagnetic wave absorber 1a is applicable to the electromagnetic wave absorber 1b, unless there is a technical inconsistency.

As shown in FIG. 3, the electromagnetic wave absorber 1b includes a first layer 10b and conductive layer 20b. The first layer 10b is configured in the same manner as the first layer 10a, unless otherwise described. The description given for the first layer 10a is applicable to the first layer 10b, unless there is a technical inconsistency. The conductive layer 20b is configured in the same manner as the conductive layer 20a, unless otherwise described. The description given for the conductive layer 20a is applicable to the conductive layer 20b, unless there is a technical inconsistency.

As shown in FIG. 3, the electromagnetic wave absorber 1b does not include the resistive layer 30. The first layer 10b is a dielectric layer or magnetic layer. When the first layer 10b is a dielectric layer, the electromagnetic wave absorber 1b is a dielectric loss-type electromagnetic wave absorber absorbing an electromagnetic wave using a dielectric loss attributed to molecular polarization. In the dielectric loss-type electromagnetic wave absorber, the molecular polarization cannot follow a change in an electric field and the energy of an electromagnetic wave is lost as heat. In this case, in the first layer 10b, carbon particles or the like are dispersed, for example, in the synthetic resin or synthetic rubber mentioned above as the material of the polymer sheet of the first layer 10a which is a dielectric layer. The conductive layer 20b prevents an electromagnetic wave to be absorbed from passing through the electromagnetic wave absorber 1b, as the conductive layer 20a does.

When the first layer 10b is a magnetic layer, the electromagnetic wave absorber 1b is a magnetic loss-type electromagnetic wave absorber absorbing an electromagnetic wave by means of a magnetic loss of a magnetic material. In the magnetic loss-type electromagnetic wave absorber, a magnetic moment cannot follow a change in a magnetic field and the energy of an electromagnetic wave is lost as heat. In this case, in the first layer 10b, particles of a magnetic material such as ferrite, iron, or nickel are dispersed in the synthetic resin or synthetic rubber mentioned above as the material of the polymer sheet of the first layer 10a which is a dielectric layer. The conductive layer 20b prevents an electromagnetic wave to be absorbed from passing through the electromagnetic wave absorber 1b, as the conductive layer 20a does.

EXAMPLES

Hereinafter, the present invention will be described in more detail by examples. The present invention is not limited to the examples given below.

Example 1

On a film-like support (Mitsubishi DIAFOIL manufactured by Mitsubishi Polyester Film Corporation, thickness: 38 μm) made of a polyester was formed a functional layer using an ITO including 30 weight % of $SnO_2$ to have a sheet resistance of 380Ω/□. A resistive layer according to Example 1 was thus produced. An acrylic rubber (silver-coated copper SCF104 manufactured by Plascoat Co., Ltd.) including a silver-coated copper powder was applied to have a sheet resistance of 10Ω/□ or less with a bar coater onto a film-like support (Kurangile manufactured by KURABO INDUSTRIES LTD., thickness: 50 μm) made of polyurethane, and the resultant coating was heated at 120° C. for 1 minute to remove a solvent. A conductive layer according to Example 1 was thus produced. An acrylic resin (KURARITY LA2330 manufactured by KURARAY CO., LTD.) which is a dielectric layer and press-molded to have a thickness of 560 μm was put on the principal surface of the conductive layer, the principal surface formed of the acrylic rubber including the silver-coated copper powder. On the acrylic resin (dielectric layer) was placed the resistive layer with the principal surface formed of the support of the resistive layer toward the acrylic resin. An electromagnetic wave absorber according to Example 1 was obtained in this manner. The relative permittivity of the dielectric layer of the electromagnetic wave absorber according to Example 1 is 2.55.

Example 2

An electromagnetic wave absorber according to Example 2 was produced in the same manner as in Example 1, except that an acrylic rubber (silver-coated copper SCF105 manufactured by Plascoat Co., Ltd.) including a silver-coated copper powder and having a silver coating amount smaller than that of the silver-coated copper SCF104 was used instead of the silver-coated copper SCF104.

Example 3

A conductive layer according to Example 3 was produced by mixing 600 parts by weight of silver-coated copper (TMF-C05F manufactured by Toyo Aluminium K.K, content of silver: 20 mass %) into 100 parts by weight of an acrylic resin (KURARITY LA2330 manufactured by KURARAY CO., LTD) and forming the resultant mixture in the shape of a 100-μm-thick sheet. An electromagnetic wave absorber according to Example 3 was produced in the same manner as in Example 1, except that the conductive layer according to Example 3 was used instead of the conductive layer according to Example 1.

Example 4

A functional layer was formed to have a sheet resistance of 380Ω/□ by applying with a bar coater a PEDOT/PSS dispersion manufactured by CHUKYO YUSHI CO., LTD. onto a film-like support (Mitsubishi DIAFOIL manufactured by Mitsubishi Polyester Film Corporation, thickness: 38 μm) made of a polyester. A resistive layer according to Example 4 was thus produced. An electromagnetic wave absorber according to Example 4 was produced in the same manner as in Example 1, except that the resistive layer according to Example 4 was used instead of the resistive layer according to Example 1. The PEDOT/PSS dispersion was prepared by mixing the following materials in the following amounts.

Conductive coating agent (2 mass % methanol solution of Doudencoat R-801): 5.0 g Methanol: 5.0 g 1.0 mass % methanol diluent of curing agent P-795: 0.5 g 1.0 mass % methanol diluent of curing agent Q-113: 2.0 g 1.0 mass % methanol diluent of leveling agent R-438: 0.1 g Example 5

Onto a film-like support (Mitsubishi DIAFOIL manufactured by Mitsubishi Polyester Film Corporation, thickness: 38 μm) made of a polyester was applied a carbon nanotube dispersion (WaterSolution Gen2.3 manufactured by KH Chemicals Co., Ltd.) with a bar coater to have a sheet resistance of 380Ω/□. The coating was dried at 130° C. for 3 minutes and washed with water, followed by drying at 90° C. for another 3 minutes to form a functional layer. A resistive layer according to Example 5 was thus produced. An electromagnetic wave absorber according to Example 5 was produced in the same manner as in Example 1, except that the resistive layer according to Example 5 was used instead of the resistive layer according to Example 1.

Example 6

An electromagnetic wave absorber according to Example 6 was produced in the same manner as in Example 1, except that an aluminum foil-including PET film which is manufactured by UACJ Corporation and in which a 25-μm-thick PET layer, 7-μm-thick aluminum layer, and 9-μm-thick PET layer are stacked in this order was used instead of the conductive layer according to Example 1.

Example 7

An electromagnetic wave absorber according to Example 7 was produced in the same manner as in Example 1, except that an aluminum foil (manufactured by NIPPON FOIL MFG. CO., LTD., thickness: 12 μm) was used instead of the conductive layer according to Example 1.

Example 8

To 100 parts by weight of an EVA resin (EVAFLEX EV250 manufactured by Du Pont-Mitsui Fluorochemicals Company, Ltd.) was added 300 parts by weight of a carbonyl iron powder YW1 manufactured by New Metals and Chemicals Corporation, Ltd. The materials were kneaded with a mixing roll and then press-molded at 120° C. to produce a sheet-shaped dielectric layer (dielectric layer according to Example 8) having a thickness of 1200 μm. The relative permittivity of the dielectric layer according to Example 8 is 6.6. An aluminum foil-including PET film as used in Example 6 was bonded to one principal surface of the dielectric layer according to Example 8 to produce an electromagnetic wave absorber according to Example 8.

Example 9

An electromagnetic wave absorber according to Example 9 was produced in the same manner as in Example 1, except that a copper foil-including PET film which is manufactured by PANAC Co., Ltd. and in which a 12-μm-thick copper foil and 50-μm-thick PET film are stacked was used instead of the conductive layer according to Example 1.

Example 10

An electromagnetic wave absorber according to Example 10 was produced in the same manner as in Example 1, except that a 100-μm-thick aluminum foil was used instead of the conductive layer according to Example 1.

Example 11

On a film-like support (Mitsubishi DIAFOIL manufactured by Mitsubishi Polyester Film Corporation, thickness: 38 μm) made of a polyester was formed an ITO layer using an ITO including 10 weight % of $SnO_2$ to have a sheet resistance of 100Ω/□. A conductive layer according to Example 11 was thus produced. An electromagnetic wave absorber according to Example 11 was produced in the same manner as in Example 1, except that the conductive layer according to Example 11 was used instead of the conductive layer according to Example 1.

Example 12

An electromagnetic wave absorber according to Example 12 was produced in the same manner as in Example 6, except that a 500-μm-thick polycarbonate sheet having surfaces to each of which a 0.05-mm-thick acrylic adhesive sheet (CS9862UA manufactured by Nitto Denko Corporation) is bonded was used as a dielectric layer.

Comparative Example 1

On a film-like support (Mitsubishi DIAFOIL manufactured by Mitsubishi Polyester Film Corporation, thickness: 38 μm) made of a polyester was formed a resistive layer according to Comparative Example 1 using an ITO including 30 weight % of $SnO_2$ to have a sheet resistance of 380Ω/□. An aluminum-deposited polyamide film (HARDEN N7476 manufactured by TOYOBO CO., LTD., thickness of polyamide film: 15 μm) was prepared as a conductive layer according Comparative to Example 1. An acrylic resin (KURARITY LA2330 manufactured by KURARAY CO., LTD.) which is a dielectric layer and press-molded to have a thickness of 560 μm was put on the aluminum-deposited surface of the conductive layer according to Comparative Example 1. On the acrylic resin (dielectric layer) was placed the resistive layer with the principal surface formed of the support of the resistive layer toward the acrylic resin. An electromagnetic wave absorber according to Comparative Example 1 was produced in this manner.

Comparative Example 2

An electromagnetic wave absorber according to Comparative Example 2 was produced in the same manner as in Comparative Example 1, except that an aluminum-deposited CPP film (CP W820 manufactured by Mitsui Chemicals Tohcello, Inc., thickness of CPP film: 20 μm) was used instead of the conductive layer according to Comparative Example 1.

Comparative Example 3

An electromagnetic wave absorber according to Comparative Example 3 was produced in the same manner as in Comparative Example 1, except that MER manufactured by Meiwa Pax Co., Ltd. was used instead of the conductive layer according to Comparative Example 1. MER manufactured by Meiwa Pax Co., Ltd. is a 30-μm-thick CPP film subjected to aluminum deposition, and the aluminum-deposited surface is surface-treated.

Comparative Example 4

To 100 parts by weight of an acrylic resin (KURARITY LA2330 manufactured by KURARAY CO., LTD.) was added 400 parts by weight of Carbonyl Ni 123 manufactured by Fukuda Metal Foil & Powder Co., Ltd. A sheet formed to have a thickness of 120 μm was produced by a pressing machine to obtain a conductive layer according to Comparative Example 4. An electromagnetic wave absorber according to Comparative Example 4 was produced in the same manner as in Comparative Example 1, except that the conductive layer according to Comparative Example 4 was used instead of the conductive layer according to Comparative Example 1.

Comparative Example 5

An electromagnetic wave absorber according to Comparative Example 5 was produced in the same manner as in Comparative Example 1, except that a 500-μm-thick aluminum plate was used instead of the conductive layer according to Comparative Example 1.

Comparative Example 6

An electromagnetic wave absorber according to Comparative Example 6 was produced in the same manner as in Comparative Example 5, except that a 500-μm-thick polycarbonate sheet having surfaces to each of which a 0.05-mm-thick acrylic adhesive sheet (CS9862UA manufactured by Nitto Denko Corporation) is bonded was used as a dielectric layer.

The electromagnetic wave absorbers according to Examples and Comparative Examples were each evaluated for the flexural rigidity, adhesiveness to a curved face, and durability in a hot and humid environment according to the following measures. The results are shown in Table 1.

[Flexural Rigidity]

One end of each of the electromagnetic wave absorbers according to Examples and Comparative Examples was fixed to form a cantilever, a downward load is applied by a weight at the other end of the electromagnetic wave absorber to bend and deform the electromagnetic wave absorber, and the resultant deflection d [cm] was measured. The flexural rigidity EI [MPa·mm⁴] was calculated according to the following equation (1). In the following equation (1), W represents the basis weight [g/m²] of a test sample, L represents the length [cm] of the test sample, b represents the width [cm] of the test sample, F represents the weight [g] of a weight, and d represents the deflection [cm].

$$EI=\{(WLb/8)\times10^{-4}+(F/3)\}\times(V/d)\times(9.81/10)$$ Equation (1)

[Adhesiveness to Curved Face]

A state of each of the electromagnetic wave absorbers according to Examples and Comparative Examples adhered using a 0.05-mm-thick transparent adhesive sheet (CS9862UA manufactured by Nitto Denko Corporation) to a steel plate bent to R150 (curvature radius: 150 mm) was observed. The evaluation was made according to the following measures.

a: An electromagnetic wave absorber deforms along a curved face of a steel plate and is fit tightly to the steel plate after adhered thereto.

sion loss (dB) of a 76-GHz millimeter wave according to JIS R 1679 (Measurement methods for reflectivity of electromagnetic wave absorber in millimetre wave frequency). This measurement was performed three times for each of the electromagnetic wave absorbers according to Examples and Comparative Examples, and the average value of the three resultant values was determined as the transmission loss in each Example or Comparative Example. Additionally, the sheet resistance of the conductive layer of each of the electromagnetic wave absorbers according to Examples and Comparative Examples was measured using a sheet resistance detector according to a non-contact method (eddy current method).

a: The transmission loss is 41 dB to 100 dB.

b: The transmission loss is 10 dB to 40 dB.

x: The transmission loss is less than 10 dB.

| | Conductive layer | | | Dielectric layer | | Resistive layer | | Bending | Durability test in hot and humid environment | |
|---|---|---|---|---|---|---|---|---|---|---|
| | Conductive material | Support | Young's modulus × thickness [MPa · mm] | Material | Young's modulus × thickness [MPa · mm] | Material of functional layer | Support | Flexural rigidity [MPa · mm⁴] | properties and adhesiveness | Sheet resistance [Ω/□] | Transmission loss |
| Example 1 | Silver coated copper | Polyurethane | 0.72 | Acrylic rcein | 0.56 | ITO | PET | 175 | a | <10 | a |
| Example 2 | Silver coated copper | Polyurethane | 0.72 | Acrylic resin | 0.56 | ITO | PET | 178 | a | <10 | a |
| Example 3 | Silver coated copper | — | 0.80 | Acrylic resin | 0.56 | ITO | PET | 170 | a | <10 | a |
| Example 4 | Silver coated copper | Polyurethane | 0.72 | Acrylic resin | 0.66 | PEDOT/PSS | PET | 170 | a | <10 | a |
| Example 5 | Silver coated copper | Polyurethane | 0.72 | Acrylic resin | 0.56 | CNT | PET | 173 | a | <10 | a |
| Example 6 | Aluminum foil | PET | 200 | Acrylic resin | 0.56 | ITO | PET | 680 | a | <10 | a |
| Example 7 | Aluminum foil | — | 828 | Acrylic resin | 0.66 | ITO | PET | 845 | a | <10 | a |
| Example 8 | Aluminum foil | PET | 200 | Acrylic resin + carbonyl iron | 96 | — | — | 191 | a | <10 | a |
| Example 9 | Copper foil | PET | 1404 | Acrylic resin | 0.56 | ITO | PET | 903 | a | <10 | a |
| Example 10 | Aluminum foil | — | 6900 | Acrylic resin | 0.56 | ITO | PET | 3120 | a | <10 | a |
| Example 11 | ITO | PET | 194 | Acrylic resin | 0.56 | ITO | PET | 651 | b | 100 | b |
| Example 12 | Aluminum foil | PET | 200 | PC | 1125 | ITO | PET | 4500 | a | <10 | a |
| Comparative Example 1 | Deposited Aluminum | Polyamide | 39 | Acrylic resin | 0.56 | ITO | PET | 200 | a | >1000 | x |
| Comparative Example 2 | Deposited Aluminum | CPP | 8 | Acrylic resin | 0.56 | ITO | PET | 284 | a | >1000 | x |
| Comparative Example 3 | Deposited Aluminum | CPP | 12 | Acrylic resin | 0.56 | ITO | PET | 300 | a | >1000 | x |
| Comparative Example 4 | Carbonyl Ni 123 | — | 200 | Acrylic resin | 96 | ITO | PET | 179 | a | >1000 | x |
| Comparative Example 5 | Aluminum plate | — | 34500 | Acrylic resin | 0.56 | ITO | PET | 7530 | x | <10 | a |
| Comparative Example 6 | Aluminum plate | — | 34500 | PC | 1125 | ITO | PET | 11220 | x | <10 | a | b: Although an electromagnetic wave absorber deforms along a curved face of a steel plate, the electromagnetic wave absorber is creased.

x: An electromagnetic wave absorber cannot deform along a curved face of a steel plate, and it is difficult adhere the electromagnetic wave absorber.

[Durability in Hot and Humid Environment]

After left in an environment having a temperature of 85° C. and a relative humidity of 85% for 1000 hours, each of the electromagnetic wave absorbers according to Examples and Comparative Examples was measured for the transmis-

The invention claimed is:

1. An electromagnetic wave absorber, comprising:
   a first layer being a dielectric layer or a magnetic layer; and
   a conductive layer provided on at least one surface of the first layer, wherein the conductive layer has a sheet resistance of 100Ω/□ or less after the electromagnetic wave absorber is exposed to an environment having a temperature of 85° C. and a relative humidity of 85% for 1000 hours,
   the electromagnetic wave absorber has a flexural rigidity of 5000 MPa·mm⁴ or less, and an amount of reflection and absorption of a 76-GHz millimeter wave measured according to Japanese Industrial Standards (JIS) R 1679 after an exposure to an environment having a temperature of 85° C. and a relative humidity of 85% for 1000 hours is 15 dB or more.

2. The electromagnetic wave absorber according to claim 1, wherein the conductive layer comprises a metal.

3. The electromagnetic wave absorber according to claim 1, wherein a product of a Young's modulus of the conductive layer and a thickness of the conductive layer is 0.01 to 34000 MPa·mm.

4. The electromagnetic wave absorber according to claim 1, wherein a product of a Young's modulus of the first layer and a thickness of the first layer is 0.1 to 1200 MPa·mm.

5. The electromagnetic wave absorber according to claim 1, wherein the first layer has a Young's modulus of 0.1 to 2500 MPa.

6. The electromagnetic wave absorber according to claim 1, wherein the conductive layer comprises surface-treated metal particles.

7. The electromagnetic wave absorber according to claim 1, wherein the conductive layer comprises a metal foil having a thickness of 1 to 490 μm.

8. The electromagnetic wave absorber according to claim 1, wherein the conductive layer comprises a support being a polymer sheet.

9. The electromagnetic wave absorber according to claim 1, further comprising a resistive layer provided on at least one surface of the first layer, wherein
the first layer is the dielectric layer and disposed between the resistive layer and the conductive layer.

10. The electromagnetic wave absorber according to claim 9, wherein the resistive layer has a sheet resistance of 200 to 600Ω/□.

11. The electromagnetic wave absorber according to claim 9, wherein the dielectric layer is formed of a polymer sheet having a relative permittivity of 1 to 20.

12. The electromagnetic wave absorber according to claim 1, wherein a transmission loss of a 76-GHz millimeter wave measured according to Japanese Industrial Standards (JIS) R 1679 after the electromagnetic wave absorber is exposed to an environment having a temperature of 85° C. and a relative humidity of 85% for 1000 hours is 10 dB or more.

13. The electromagnetic wave absorber according to claim 1, further comprising an adhesive layer disposed on an external side of the conductive layer.

14. A molded article with an electromagnetic wave absorber, comprising:
a molded article; and
the electromagnetic wave absorber according to claim 1 attached to the molded article.

* * * * *